US011514775B2

(12) United States Patent
Zimmer

(10) Patent No.: US 11,514,775 B2
(45) **Date of Patent: *Nov. 29, 2022**

(54) REMOTE SWITCH DEVICE

(71) Applicant: Trent Zimmer, Broussard, LA (US)

(72) Inventor: Trent Zimmer, Broussard, LA (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/359,933

(22) Filed: Jun. 28, 2021

(65) Prior Publication Data

US 2021/0327258 A1 Oct. 21, 2021

Related U.S. Application Data

(63) Continuation of application No. 16/675,151, filed on Nov. 5, 2019, now Pat. No. 11,348,449.

(60) Provisional application No. 62/809,029, filed on Feb. 22, 2019, provisional application No. 62/756,040, filed on Nov. 5, 2018.

(51) Int. Cl.

| | |
|---|---|
| ***H01R 33/955*** | (2006.01) |
| ***H01R 33/88*** | (2006.01) |
| ***G08C 17/02*** | (2006.01) |
| ***H05K 5/00*** | (2006.01) |
| *F41G 1/34* | (2006.01) |

(52) U.S. Cl.

CPC ............. *G08C 17/02* (2013.01); *H01R 33/88* (2013.01); *H01R 33/955* (2013.01); *H05K 5/0017* (2013.01); *F41G 1/34* (2013.01)

(58) Field of Classification Search

CPC ...... G08C 17/02; H01R 33/955; H01R 33/88; H05K 5/0017; F41G 1/34; F41G 1/35; F41G 1/36; F41G 11/003; F41A 35/00; H01H 9/0235; H01H 13/70; H01H 2071/048; H01H 3/0213

USPC ............................... 340/5.1; 42/84, 146, 117

See application file for complete search history.

(56) References Cited

U.S. PATENT DOCUMENTS

| | | | | |
|---|---|---|---|---|
| 4,923,402 | A * | 5/1990 | Marshall | F41G 3/2627 235/462.49 |
| 6,345,464 | B1 | 2/2002 | Kim et al. | |
| 7,273,292 | B2 | 9/2007 | Kim | |
| 7,332,682 | B2 | 2/2008 | Kim | |
| 7,438,430 | B2 | 10/2008 | Kim | |
| 7,674,003 | B2 | 3/2010 | Sharrah et al. | |
| 8,110,760 | B2 | 2/2012 | Sharrah et al. | |
| 8,360,598 | B2 | 1/2013 | Sharrah et al. | |

(Continued)

*Primary Examiner* — Edwin C Holloway, III

(74) *Attorney, Agent, or Firm* — Asgaard Patent Services, LLC; F. Wayne Thompson, Jr.

(57) ABSTRACT

A remote switch device can be attached to a mounting interface for firearm accessories, such as a Picatinny rail interface, and used to operate power-consuming firearm accessories (e.g., an illumination device, a laser aiming module, etc.) connected thereto by a suitably configured flexible cable, or wireless transceiver. An example remote switch device comprises: a housing configured to engage with a mounting interface for firearm accessories; a first switch configured to operate at least one connected power-consuming firearm accessory, the first switch includes a force sensing resistor; and a cable or wireless transceiver configured to connect the first switch to at least one power-consuming firearm accessory. The first switch is positioned substantially parallel to the mounting interface for firearm accessories while the housing is secured thereto.

4 Claims, 18 Drawing Sheets

(56) References Cited

U.S. PATENT DOCUMENTS

| | | | | |
|---|---|---|---|---|
| 8,459,822 | B1 | 6/2013 | Lambert et al. | |
| 8,662,701 | B2 | 3/2014 | Sharrah et al. | |
| 9,991,062 | B2 | 6/2018 | Zimmer | |
| 10,151,564 | B2 | 12/2018 | Galli | |
| 11,348,449 | B2 * | 5/2022 | Zimmer | H01R 33/955 |
| 2003/0052860 | A1 | 3/2003 | Park et al. | |
| 2004/0012560 | A1 * | 1/2004 | Jasso | G09B 21/003<br>345/156 |
| 2007/0235298 | A1 | 10/2007 | Kim | |
| 2010/0031552 | A1 | 2/2010 | Houde-Walter | |
| 2010/0242332 | A1 | 9/2010 | Teetzel et al. | |
| 2011/0261559 | A1 | 10/2011 | Couture et al. | |
| 2012/0055061 | A1 | 3/2012 | Hartley et al. | |
| 2012/0131840 | A1 | 5/2012 | Toole | |
| 2014/0245650 | A1 | 9/2014 | Abst | |
| 2016/0211095 | A1 | 7/2016 | Zimmer | |
| 2019/0003804 | A1 * | 1/2019 | Deng | F41A 35/00 |
| 2020/0143667 | A1 | 5/2020 | Zimmer | |

* cited by examiner

REMOTE SWITCH DEVICE

CROSS REFERENCE TO RELATED APPLICATION

This is a continuation application claiming the benefit of U.S. patent application Ser. No. 16/675,151, filed on Nov. 5, 2019, which claims the benefit of U.S. Provisional Application Ser. No. 62/756,040, filed on Nov. 5, 2018, and U.S. Provisional Application Ser. No. 62/809,029, filed on Feb. 22, 2019, the entireties of all three applications are incorporated herein by reference.

TECHNICAL FIELD

This disclosure relates to implementations of a modular electronic switch system. In particular, the present invention is primarily directed to implementations of a modular electronic switch system that can be configured to operate one or more electrical accessories.

BACKGROUND

Switch operated electrical accessories, such as illumination tools, IR illuminators and lasers, are often adapted for being secured to firearms. These electrical accessories are often mounted to a firearm so that any emitted light beam is parallel, or substantially parallel, to the longitudinal axis of the firearm's barrel.

Remote switches are often used to operate one or more electrical accessories mounted on the same firearm. These remote switches often include one or more cables, each cable includes a plug that is removably connectable to a complementary jack of an electrical accessory. In this way, the firearm user is provided with a single switch device that can be remotely positioned relative to the one or more electrical accessories its connected to. Example remote switches are described in U.S. Pat. No. 7,332,682 to Paul Y. Kim, and U.S. Pat. No. 9,991,062 to Trent Zimmer.

A modular remote switch device would be highly desirable as there are many different types of firearm mounted electrical accessories and many different preferences for their mounting and operation. The ability of a user to mount an electrical accessory in a particular location on a firearm with a particular presentation of the controls is paramount to ease of use and user effectiveness.

Accordingly, it can be seen that needs exist for the modular electronic switch system disclosed herein. It is to the provision of a modular electronic switch system that is configured to address these needs, and others, that the present invention in primarily directed.

SUMMARY OF THE INVENTION

Implementations of a remote switch device are provided. An example remote switch device can be attached to a mounting interface for firearm accessories, such as a Picatinny rail interface, and used to operate power-consuming firearm accessories (e.g., an illumination device, a laser aiming module, etc.) connected thereto by a suitably configured flexible cable, or wireless transceiver. In this way, the remote switch device can be remotely positioned relative to any connected firearm accessory.

An example remote switch device comprises: a housing configured to engage with a mounting interface for firearm accessories; a first switch configured to operate conductively connected power-consuming firearm accessories, the first switch includes a force sensing resistor; and at least a first cable having a connector, the first cable is configured to conductively connect the first switch to the connector, the connector is adapted for being conductively connected to a complementary connecter of a power-consuming firearm accessory. The first switch is positioned substantially parallel to the mounting interface for firearm accessories while the housing is secured thereto.

Another example remote switch device comprises: a housing configured to engage with a mounting interface for firearm accessories; a first switch configured to operate at least one wirelessly connected power-consuming firearm accessory, the first switch includes a force sensing resistor; and a wireless transceiver configured to operably connect the first switch to at least one wirelessly connected power-consuming firearm accessory. The first switch is positioned substantially parallel to the mounting interface for firearm accessories while the housing is secured thereto.

BRIEF DESCRIPTION OF THE DRAWINGS

Like reference numerals refer to corresponding parts throughout the several views of the drawings.

DETAILED DESCRIPTION

Figure 1A:
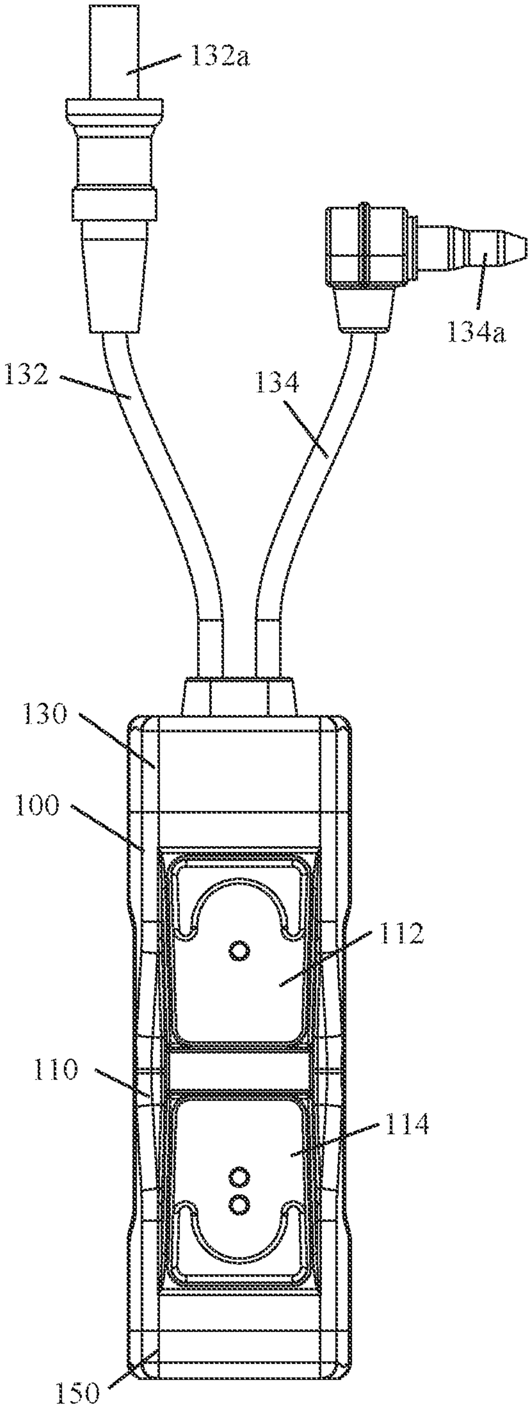
FIGS. 1A and 1B illustrate an example modular electronic switch system according to the principles of the present disclosure.
Figure 1B:
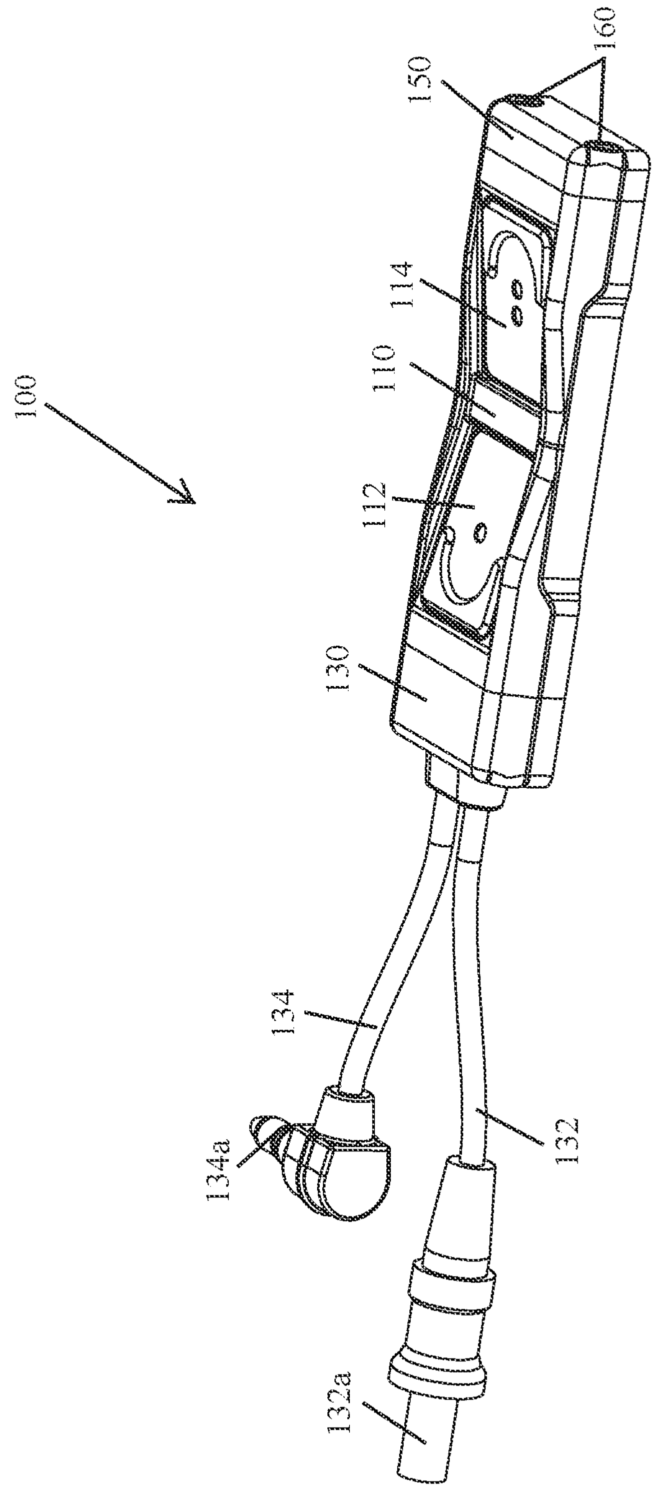
Figure 1C:
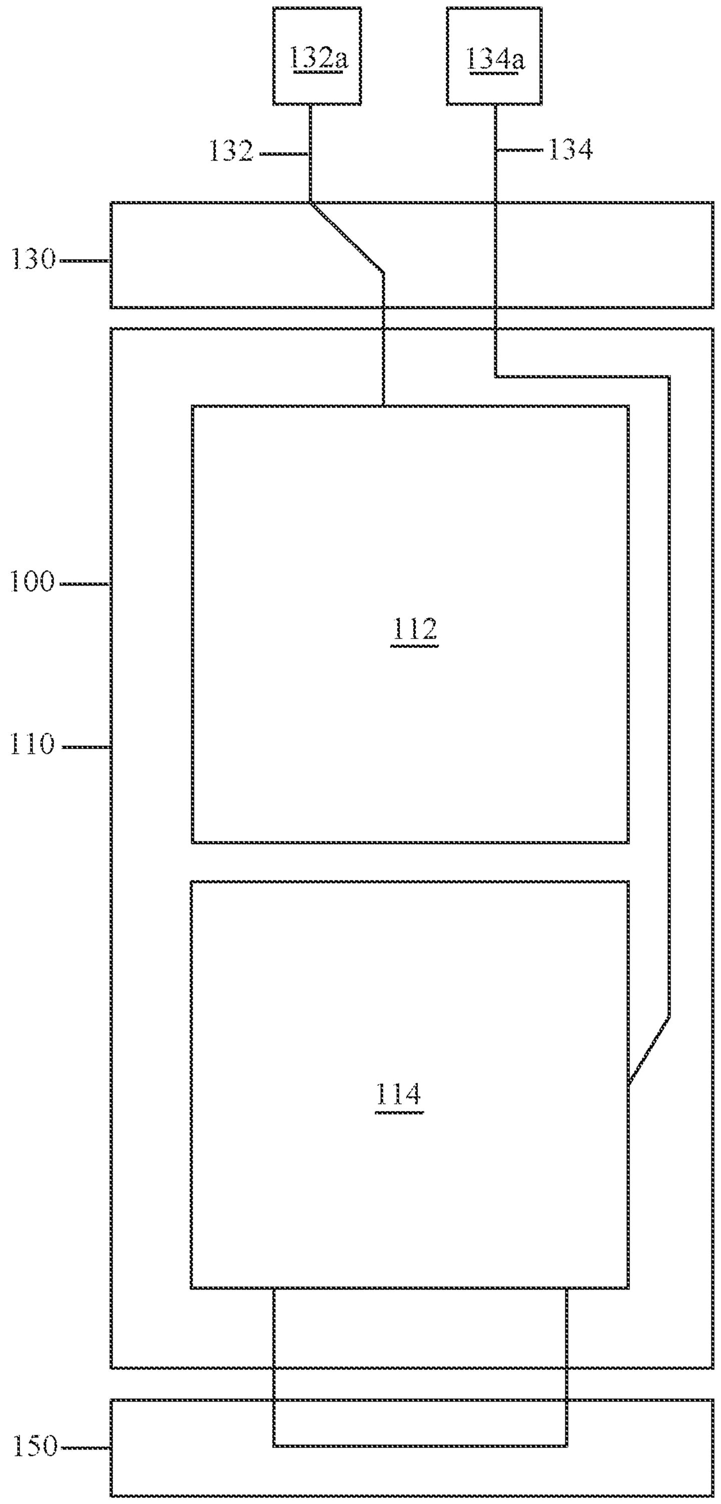
FIG. 1C illustrates an example schematic diagram of the modular electronic switch system shown in FIGS. 1A and 1B.

FIGS. 1A-1C illustrate an example implementation of a modular electronic switch system 100 according to the principles of the present disclosure. The modular electronic switch system 100 can be used to operate (e.g., turn on/off) power-consuming firearm accessories (e.g., an illumination device, a laser aiming module, etc.) conductively connected thereto by a suitably configured flexible cable. In this way, the modular electronic switch system 100 can be remotely positioned relative to any conductively connected power-consuming firearm accessory. In some implementations, the modular electronic switch system 100 can be secured to a mounting interface for firearm accessories (e.g., KeyMod or M-LOK® negative space mounting slots, or a Pica tinny rail interface).

As shown in FIGS. 1A and 1B, in some implementations, the modular electronic switch system 100 may comprise a switch body 110 that includes a first switch 112 and a second switch 114; a cable module 130 that includes a first cable 132 and a second cable 134; and an end cap 150. In some implementations, the cable module 130 and the end cap 150 are removably secured to a first end and a second end, respectively, of the switch body 110 by fasteners 160 (e.g., threaded fasteners). When assembled, the modular electronic switch system 100 may be watertight.

In some implementations, a switch (e.g., the first switch 112 or the second switch 114) of the switch body 110 may be configured to turn a conductively connected power-consuming firearm accessory ON while being pressed and OFF when released (i.e., act as a momentary ON switch). In some implementations, a switch (e.g., the first switch 112 or the second switch 114) of the switch body 110 may be configured to turn a conductively connected power-consuming firearm accessory ON when pressed and released, and OFF when pressed and released a second time (i.e., act as a regular ON/OFF switch). In some implementations, the first switch 112 and the second switch 114 may be conductively connected to the first cable 132 and the second cable 134, respectively. In some implementations, each cable 132, 134 includes a connector 132*a*, 134*a* (e.g., a plug) thereon that is configured to interface with a connector (e.g., a complementary jack) of a power-consuming firearm accessory. In this way, a cable 132, 134 can be used to conductively interface a power-consuming firearm accessory with a switch 112, 114.

As shown in FIGS. 1A and 1B, the end cap 150 is configured to enclose one end of the switch body 110. In some implementations, the end cap 150 may include one or more conductive traces (or wires) that form a portion of the modular electronic switch system's 100 power loop (see, e.g., FIG. 1C).

While not shown in the attached drawings, it should be understood that, in some implementations, a switch body 110 may only include one switch and/or a cable module 130 may only include one cable.

Figure 2A:
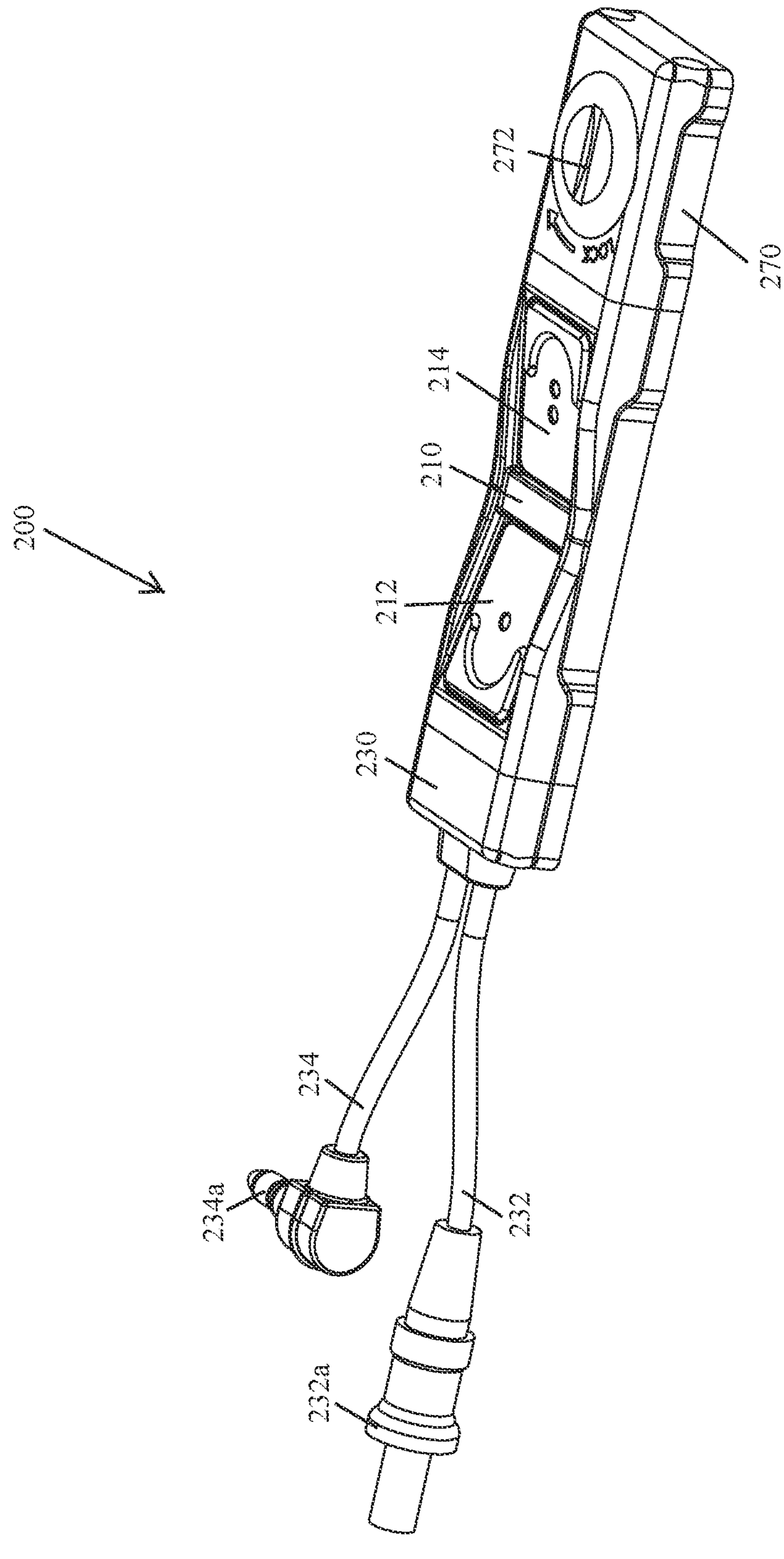
FIG. 2A illustrates another example modular electronic switch system according to the principles of the present disclosure.
Figure 2B:
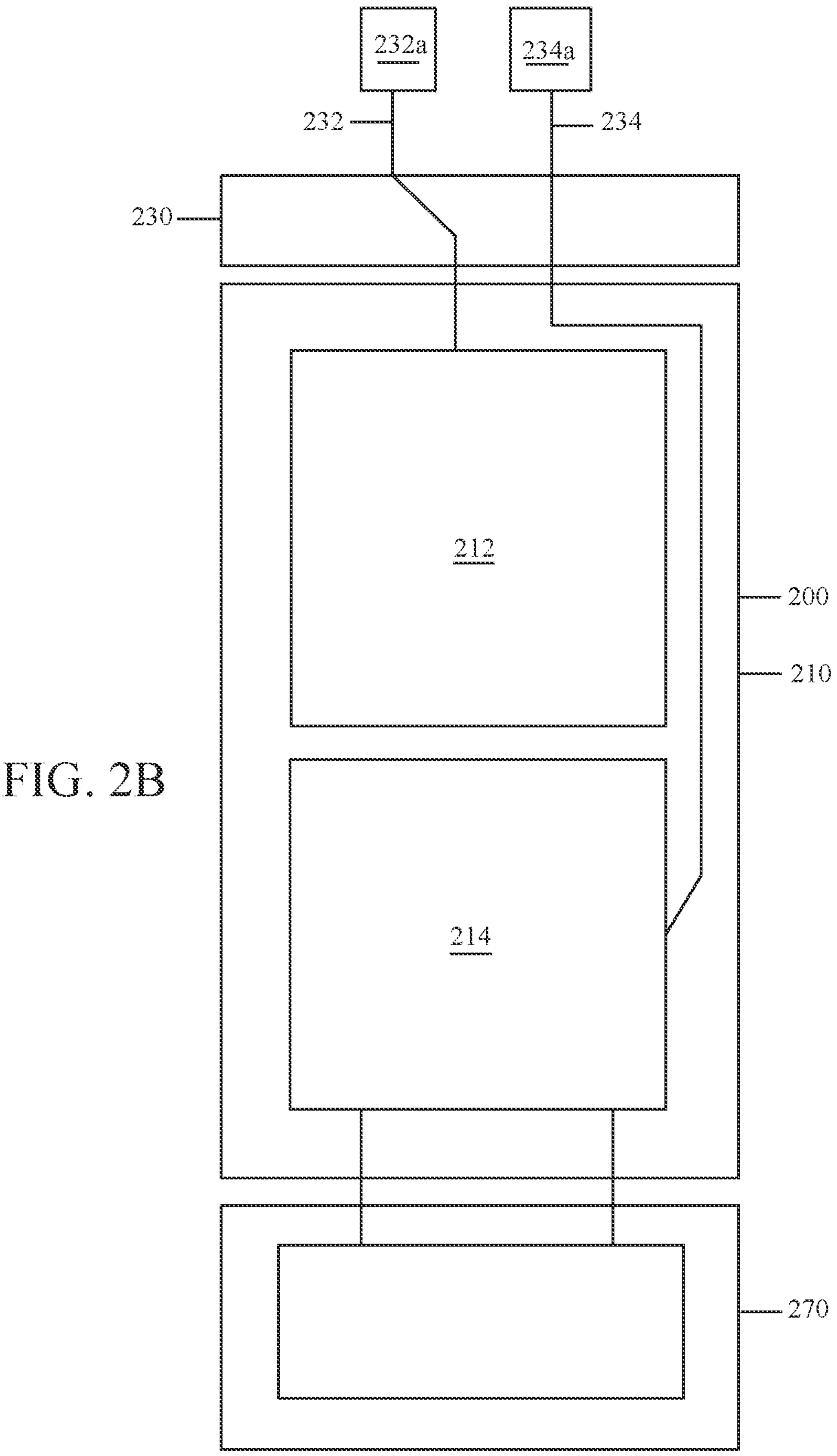
FIG. 2B illustrates an example schematic diagram of the modular electronic switch system shown in FIG. 2A.

FIGS. 2A and 2B illustrate another example implementation of a modular electronic switch system 200 according to the principles of the present disclosure. In some implementations, the modular electronic switch system 200 is similar to the modular electronic switch system 100 discussed above but further comprises a removable program module 270 secured to the second end of the switch body 210 in-lieu of an end cap 150. The cable module 230 of the modular electronic switch system 200 includes a first cable 232 and a second cable 234, each cable includes a connector 232*a*, 234*a* (e.g., a plug) thereon.

Figure 2C:
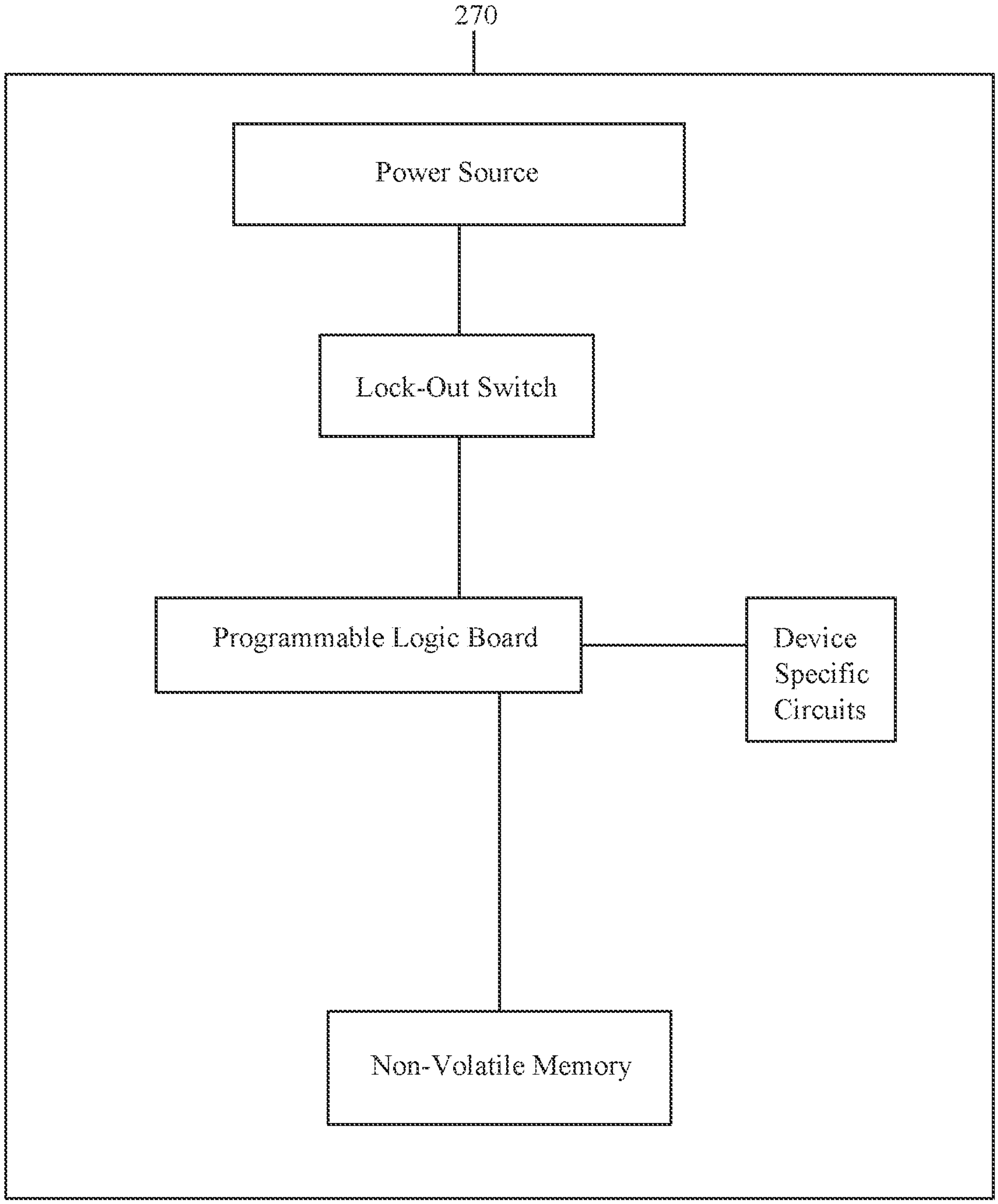
FIG. 2C illustrates an example schematic diagram of the program module shown in FIG. 2A.

As shown in FIG. 2C, in some implementations, the program module 270 comprises a power source (e.g., a battery), a programmable logic board, a nonvolatile memory, device specific circuits providing additional hardware that enables the program module 270 to perform the specific functions disclosed herein, or a suitable combination thereof. In some implementations, the power source, the programmable logic board, the nonvolatile memory, any deice specific circuits, or a combination thereof, may be mounted on one or more printed circuit boards.

The program module 270 provides for electronic control of switching operations. In this way, the modular electronic switch system 200 can provide additional switching and control capabilities not provided by a conventional switch in line with the power loop. Example switching and control capabilities appear in the following paragraphs.

In some implementations, the program module 270 is configured to set which cable(s) 232, 234 each switch 212, 214 is operationally connected to. For example, in some implementations, the program module 270 is configured to operationally connect the first switch 212 with the first cable 232, the second cable 234, or a combination thereof. In this way, the first switch 212 can be used to operate a power-consuming firearm accessory conductively connected thereto by the first cable 232 and/or the second cable 234. As another example, in some implementations, the program module 270 is configured to operationally connect the second switch 214 with the first cable 232, the second cable 234, or a combination thereof. In this way, the second switch 214 can be used to operate a power-consuming firearm accessory conductively connected thereto by the first cable 232 and/or the second cable 234.

In some implementations, the program module 270 may be used to set a mode of operation for a power-consuming firearm accessory conductively connected to a switch 212, 214 of the modular electronic switch system 200 (e.g., set a switching operation, output mode, etc.). In some implementations, each mode of operation may be a program (i.e., machine-readable instructions executable by a logic machine) stored in the nonvolatile memory of the program module 270.

In some implementations, the program module 270 may be used to set a mode of operation during which the first switch 212, the second switch 214, or a combination thereof, is configured to act as a momentary switch (i.e., the power consuming firearm accessory is ON while the switch is being pressed and OFF when the switch is released). In some implementations, the program module 270 may be used to set a mode of operation during which the first switch 212, the second switch 214, or a combination thereof, is configured to act as a regular ON/OFF switch (i.e., the power consuming firearm accessory is turned ON when the switch is pressed and released, and turned OFF when the switch is again pressed and released).

In some implementations, a switch 212, 214 of the modular electronic switch system 200 may be used to operate the program module 270 (e.g., select a program stored in the non-volatile memory of the programmable logic board).

In some implementations, when the power source of the program module 270 is exhausted, the program module 270 is configured so that each switch 212, 214 of the modular electronic switch system 200 can still complete the circuit for at least one cable 232, 234 and act as a momentary switch. In this way, the first switch 212 and the second switch 214 are able to operate a power-consuming firearm accessory conductively connected thereto by the first cable 232 and the second cable 234, respectively.

In some implementations, the program module 270 may also comprise an eccentric rotating mass (ERM) actuator that is configured to provide haptic feedback to the user. In this way, the program module 270 can provide haptic feedback (i.e., vibration(s)) when a triggering event occurs (e.g., the switching operation and/or output mode set by the program module 270 has been changed, etc.). In some implementations, the program module 270 may include a linear resonant actuator (LRA), a piezoelectric actuator, or another suitable haptic feedback device known to one of ordinary skill in the art, that is configured to provide haptic feedback to the user of a modular electronic switch system 200 equipped with a program module 270.

As shown in FIGS. 2A and 2C, in some implementations, the program module 270 may further comprise a lock-out switch 272 that is configured to deactivate all switches 212, 214 of a connected switch body 210. In this way, inadvertent activation of connected power-consuming firearm accessories may be prevented. In some implementations, the lock-out switch 272 of the program module 270 may be a rotary switch, or another suitable switch type known to one of ordinary skill in the art. In some implementations, a program module 270 may not include a lock-out switch 272 (not shown).

Figure 3:
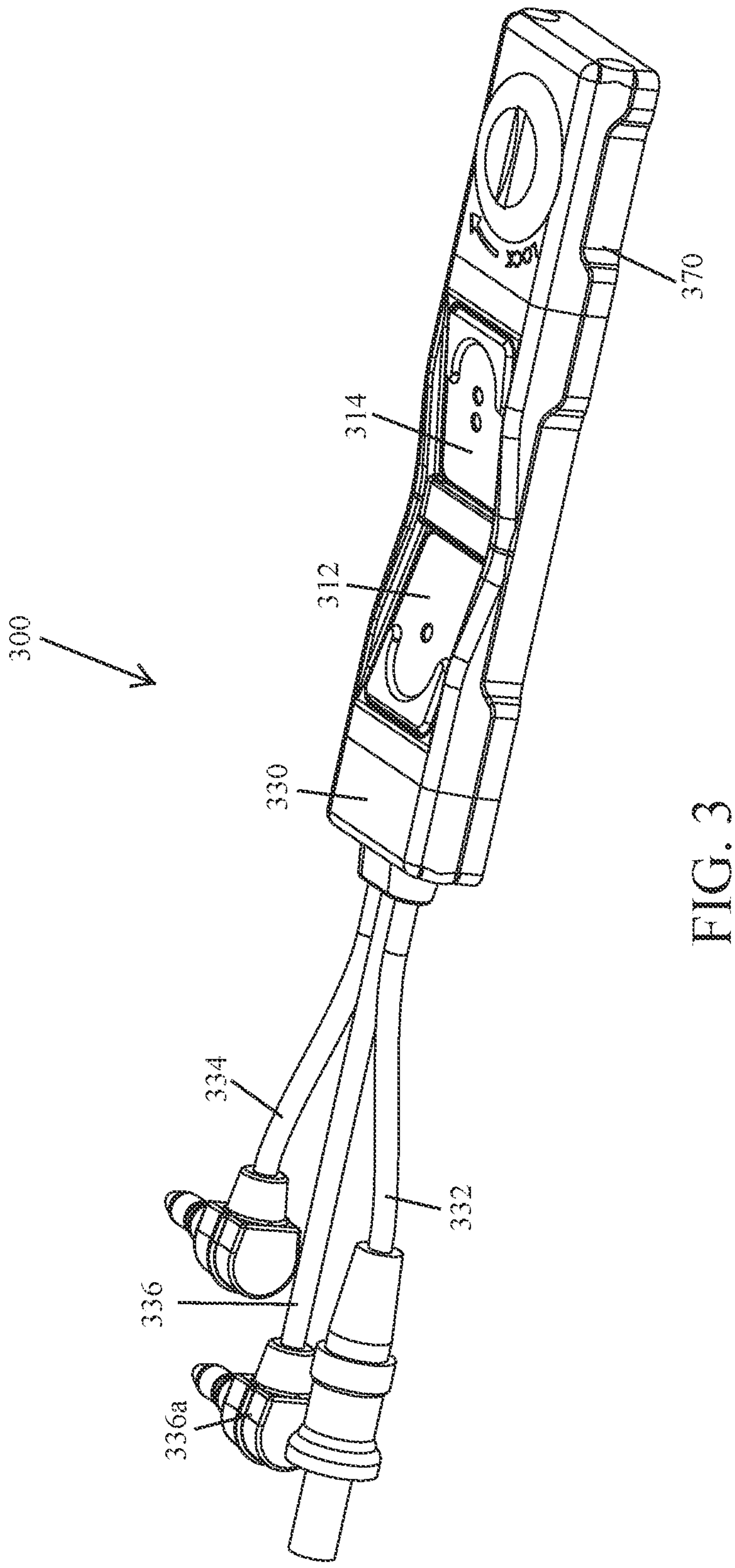
FIG. 3 illustrates yet another example modular electronic switch system according to the principles of the present disclosure.

FIG. 3 illustrates yet another example implementation of a modular electronic switch system 300 according to the principles of the present disclosure. In some implementations, the modular electronic switch system 300 is similar to the modular electronic switch systems 100, 200 discussed above but the cable module 330 includes a third cable 336 having a connector 336*a* thereon. In this way, the modular electronic switch system 300 can be used to operate three separate power-consuming firearm accessories.

In some implementations, the program module 370 may be configured to operationally connect the first switch 312 with the first cable 332, the second cable 334, the third cable 336, or a combination thereof. In some implementations, the program module 370 may be configured to operationally connect the second switch 314 with the first cable 332, the second cable 334, the third cable 336, or a combination thereof.

As discussed above, in some implementations, the program module 370 is used to set a mode of operation (e.g., set a switching operation, output mode, etc.) for a power-consuming firearm accessory conductively connected to a switch 312, 314 of the modular electronic switch system 300 by a cable 332, 334, 336 thereof.

Figure 4:
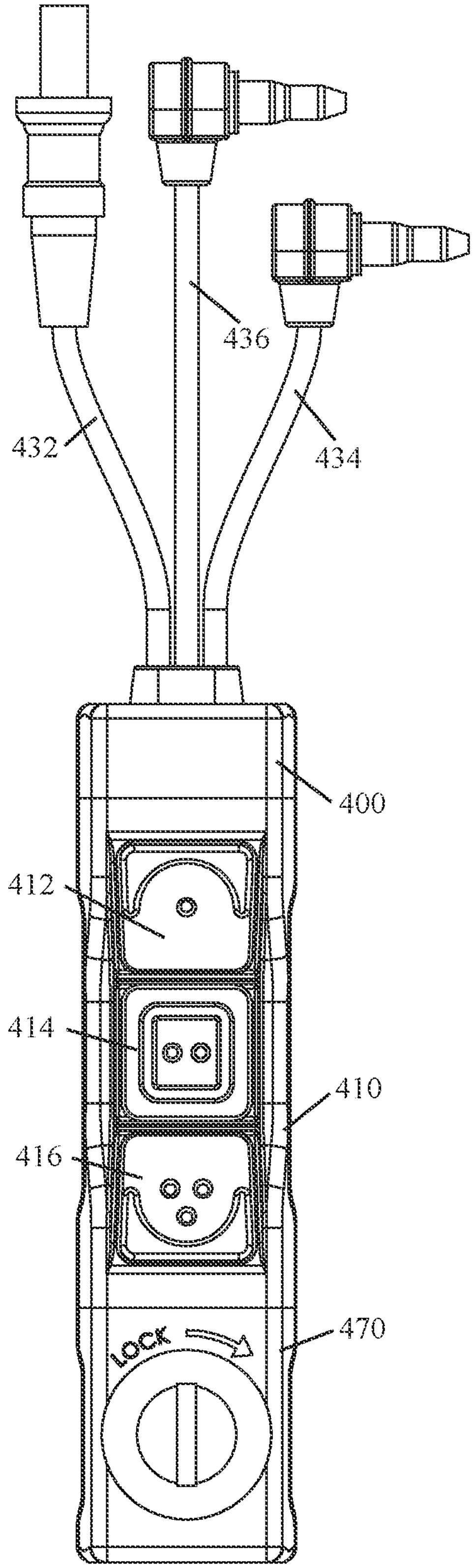
FIG. 4 illustrates still yet another example modular electronic switch system according to the principles of the present disclosure.

FIG. 4 illustrates still yet another example implementation of a modular electronic switch system 400 according to the principles of the present disclosure. In some implementations, the modular electronic switch system 400 is similar to the modular electronic switch systems 100, 200, 300 discussed above but comprises a switch body 410 that includes a first switch 412, a second switch 414, and a third switch 416; a cable module 430 that includes a first cable 432, a second cable 434, and a third cable 436; and a program module 470.

Figure 5A:
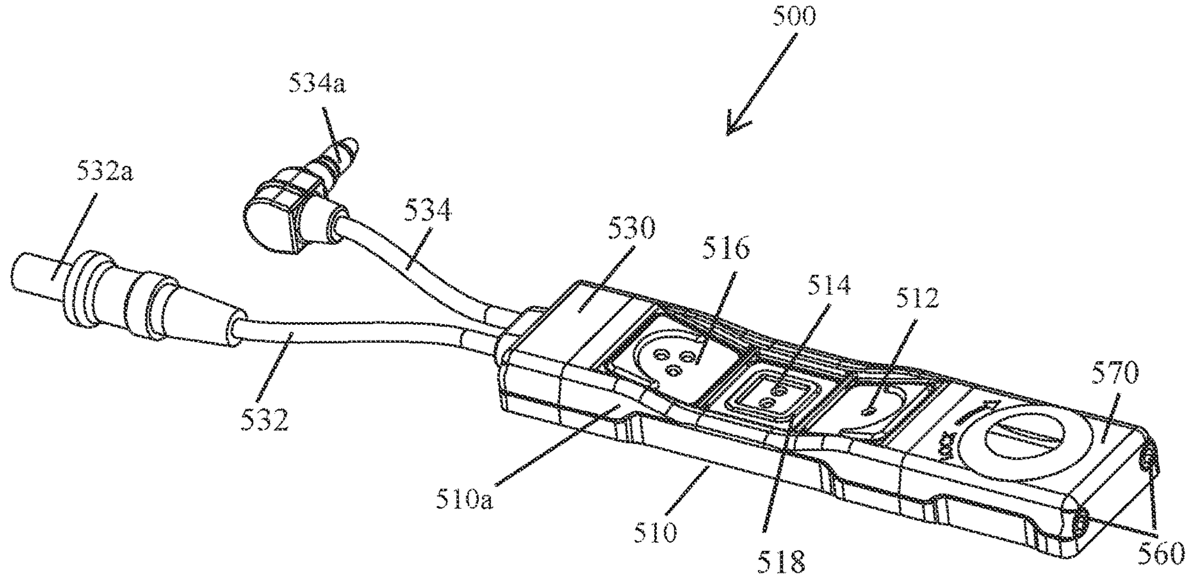
FIG. 5A illustrates yet another example modular electronic switch system according to the principles of the present disclosure.
Figure 5B:
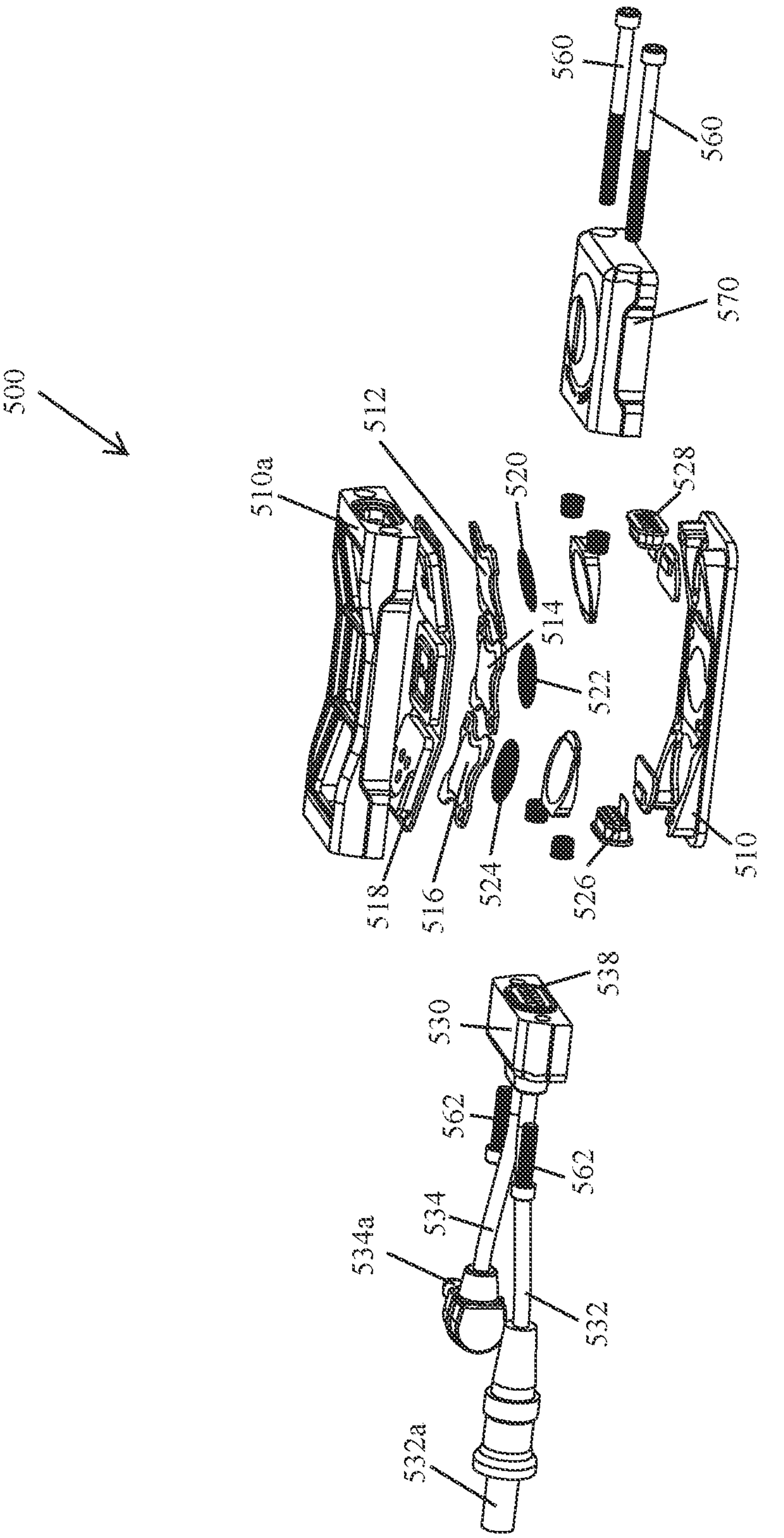
FIGS. 5B and 5C illustrate exploded views of the modular electronic switch system shown in FIG. 5A.
Figure 5C:
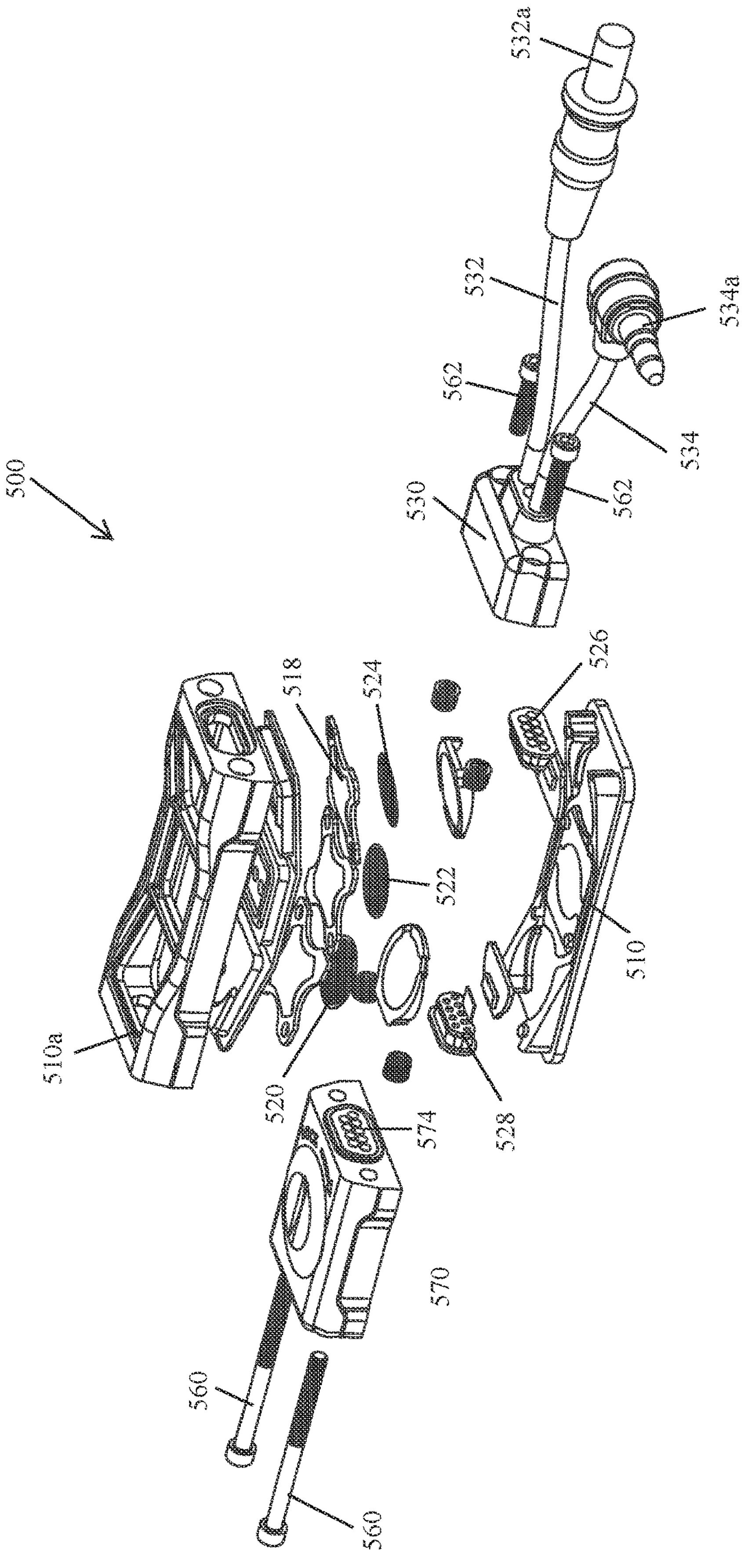

FIGS. 5A-5C illustrate yet another example implementation of a modular electronic switch system 500 according to the principles of the present disclosure. In some implementations, the modular electronic switch system 500 is similar to the modular electronic switch systems 100, 200, 300, 400 discussed above, in particular the modular electronic switch system 400 shown in FIG. 4, but comprises a switch body 510 that includes a first switch 512, a second switch 514, and a third switch 516; a cable module 530 that includes a first cable 532 and a second cable 534; and a program module 570. As discussed above, each cable includes a connector 532*a*, 542*a* thereon (e.g., a plug) that is configured to interface with a complementary connector (e.g., a jack) of a power-consuming firearm accessory. The switch body 510, the cable module 530, and the program module 570 of the modular electronic switch system 500 are removably secured together.

As shown in FIGS. 5B and 5C, in some implementations, the switch body 510 is configured to encase the switches 512, 514, 516 and, if present, the underlying force sensing resistors 520, 522, 524 of a modular electronic switch system 500. The switch body 510 may also include two jacks 526, 528, and a flexible cover 518 that acts as an overlay for each of the switches 512, 514, 516 positioned thereunder. The flexible cover 518 may be a rubberized gasket. When the switch body 510 is assembled, a portion of the flexible cover 518 overlaying each switch 512, 514, 516 may be accessible through a separate opening in the top side 510*a* of the switch body 510 (see, e.g., FIG. 5A). In this way, a user may press (or actuate) a desired switch 512, 514, 516, or switch and force sensing resistor combination (e.g., 512 and 520; 514 and 522; 516 and 524). In some implementations, the switch body 510 may include one or more water resistant, or waterproof, gaskets positioned about each opening thereof.

As shown in FIGS. 5B and 5C, in some implementations, the cable module 530 and the program module 570 each include a plug 538, 574 that is removably secured to a complementary jack 526, 528 positioned within an opening in a first end and a second end, respectively, of the switch body 510. In this way, the cable module 530 and the program module 570 can be conductively connected to the switch body 510 and thereby each other. In some implementations, the cable module 530 and the program module 570 are secured to the switch body 510 by fasteners 560, 562 (e.g., threaded fasteners). In some implementations, each fastener 560, 562 extends through a module (e.g., the cable module 530 or the program module 570) and is threadedly received within a recess of the switch body 510. In this way, a module may be removably secured to the switch body 510.

In some implementations, the first switch 512, the second switch 514, the third switch 516, or a combination thereof, may be a mechanical switch (e.g., a pushbutton switch or a dome switch). If a dome switch is used, the dome switch (e.g., switch 512, 514, 516) may be the same as, or similar to, a dome switch described in U.S. patent application Ser. No. 16/006,790, filed on Jun. 12, 2018, entitled "MULTI-POLE DOME SWITCH", by Trent Zimmer (hereinafter, "the Zimmer application"), which is also owned by the applicant of the present application and is hereby expressly incorporated by reference as if fully set forth herein. Alternatively, the dome switch (e.g., switch 512, 514, or 516) may be another type known to one of ordinary skill in the art. In some implementations, the first switch 512, the second switch 514, the third switch 516, or a combination thereof, may be any mechanical switch suitable for use as part of a modular electronic switch system 500.

As shown in FIGS. 5B and 5C, in some implementations, a force sensing resistor (FSR) 520, 522, 524 may be positioned under each switch 512, 514, 516 of the switch body 510. In this way, when one of the mechanical switches 512, 514, 516 is pressed, the force sensing resister 520, 522, 524 positioned thereunder is also pressed. In some implementations, each force sensing resistor 520, 522, 524, in conjunction with the program module 570, is configured to control (or manipulate) the output of a power-consuming firearm accessory conductively connected to the modular electronic switch system 500 by a cable 532, 534, 536 thereof. As a nonlimiting example, lightly pressing a switch 512, 514, 516 (and thereby its corresponding force sensing resistor 520, 522, 524) may cause an operationally connected power-consuming firearm accessory (e.g., a flashlight) to enter a low light output mode; while pressing the switch 512, 514, 516 hard may cause it to enter a high light output mode. Succinctly put, the program module 570 in conjunction with a force sensing resistor 520, 522, 524 responds to the magnitude of pressure placed on a switch 512, 514, 516. One of ordinary skill in the art, having the benefit of the present disclosure, would be able to select an appropriate FSR (or other force sensor) for use as part of a modular electronic switch system 500. In some implementations, a digital switch, touch sensor, or other suitable force sensor, may be positioned below each switch 512, 514, 516 of the switch body 510 instead of a force sensing resistor 520, 522, 524.

Although not shown, in some implementations, a force sensor (e.g., 520, 522, 524) may be used instead of a mechanical switch (e.g., 512, 514, 516). Succinctly put, in such an implementation, the modular electronic switch system 500 has no mechanical switch(es) and instead relies on one or more force sensors, and the program module 570, to facilitate operation of connected power-consuming accessories. In such an implementation, each force sensing resistor 520, 522, 524, in conjunction with the program module 570, can be used to control (or manipulate) the output of a power-consuming firearm accessory conductively connected to the modular electronic switch system 500 by a cable 532, 534, 536 thereof.

Figure 6B:
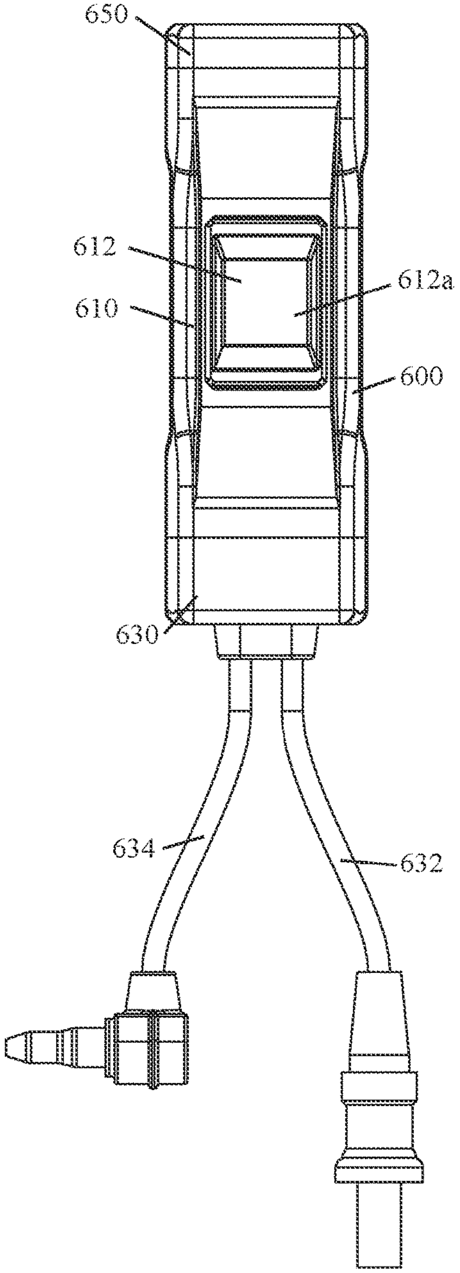
FIGS. 6A and 6B illustrate still yet another example modular electronic switch system according to the principles of the present disclosure.
Figure 6A:
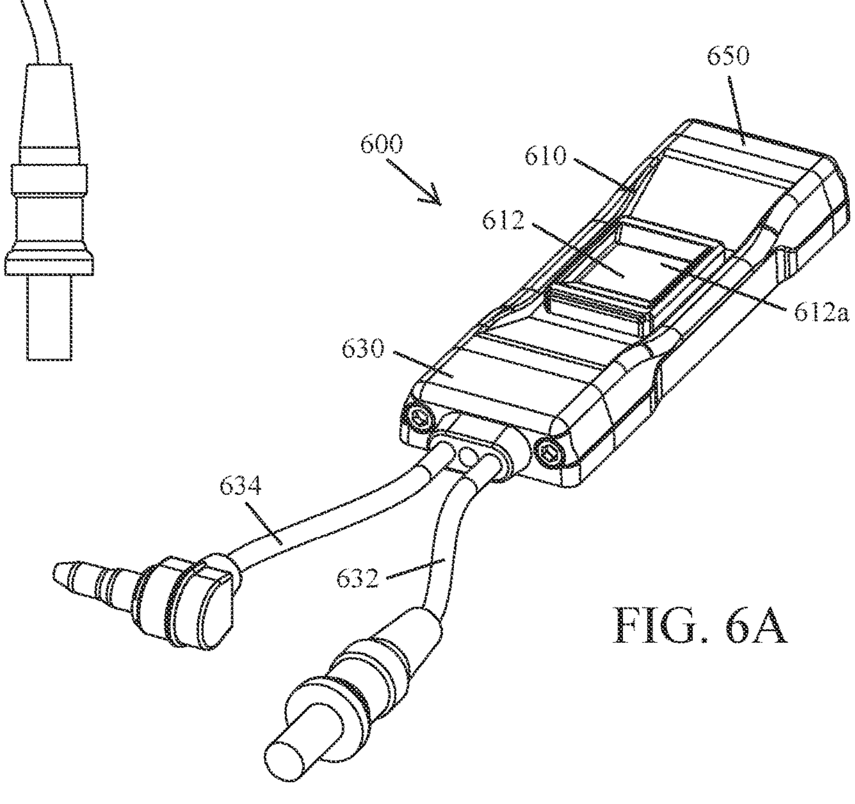
Figure 6C:
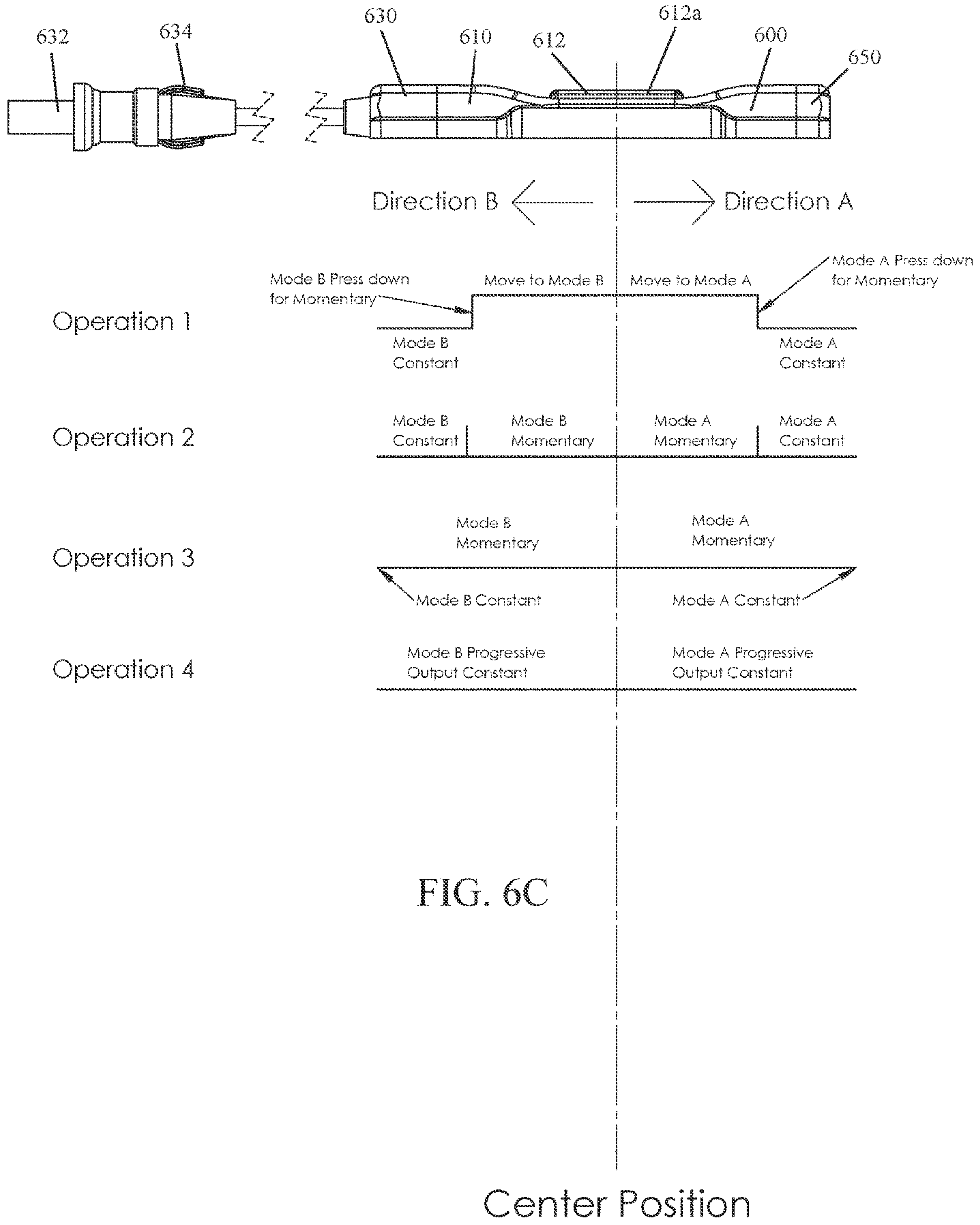
FIG. 6C illustrates example switching and control capabilities provided by the modular electronic switch system shown in FIGS. 6A and 6B.

FIGS. 6A-6C illustrate still yet another example implementation of a modular electronic switch system 600 according to the principles of the present disclosure. In some implementations, the modular electronic switch system 600 is similar to the modular electronic switch systems 100, 200, 300, 400, 500 discussed above but comprises a switch body 610 that includes a sliding switch 612; a cable module 630 that includes a first cable 632 and a second cable 634; and an end cap 650 that are removably secured together by fasteners.

In some implementations, the sliding switch 612 includes a sliding element (also referred to as a slider) 612*a* and is conductively connected to the first cable 632 and the second cable 634 of the modular electronic switch system 600. In some implementations, the sliding switch 612 may be configured so that moving the sliding element 612*a* in a first direction (e.g., towards the cable module 630 shown in FIG. 6C) completes a circuit and turns ON a power-consuming firearm accessory connected to the first cable 632 and/or the second cable 634. In some implementations, the sliding switch 612 may be configured so that moving the sliding element 612*a* in a second direction (e.g., towards the end cap 650 shown in FIG. 6C) completes a circuit and turns ON a power-consuming firearm accessory connected to the second cable 634 and/or the first cable 632.

In some implementations, moving the sliding element 612*a* of the sliding switch 612 a first distance forward (or rearward) from the center of its travel path (or rest position) will complete a circuit and turn ON a power-consuming firearm accessory conductively connected thereto via the first cable 632 (or the second cable 634 if the sliding element 612*a* was moved rearward). When the sliding element 612*a* is released, the sliding element 612*a* will return to its rest position (i.e., the center of its travel path) and the conductively connected power-consuming firearm accessory will turn OFF.

In some implementations, moving the sliding element 612*a* of the sliding switch 612 a second distance forward (or rearward) from the center of its travel path (or rest position) will lock (or latch) the sliding element 612*a* in position, complete a circuit, and turn ON a power-consuming firearm accessory conductively connected thereto via the first cable 632 (or the second cable 634 if the sliding element 612*a* was moved rearward). To turn OFF the power-consuming firearm accessory, the sliding element 612*a* is pressed down to unlock (or unlatch) it and then released so that it can return to its rest position. In some implementations, the second distance of the sliding element 612*a* is a greater distance from the center of the sliding switch travel path than is the first distance (i.e., the second distance of the sliding element 612*a* is further from the center of its travel path than is the first distance).

FIG. 6C illustrates example switching and control capabilities (i.e., Operation 1, 2, 3, and 4) provided by a modular electronic switch system 600 that includes a switch body 610 having a sliding switch 612.

Operation 1: in some implementations, moving the sliding element 612*a* of the sliding switch 612 a first distance forward (i.e., Direction B), or rearward (i.e., Direction A), from the center of its travel path (or rest position) and pressing down will complete a circuit and turn ON a power-consuming firearm accessory conductively connected thereto via the first cable 632, or the second cable 634 if the sliding element 612*a* was moved rearward. When the sliding element 612*a* is released, the sliding element 612*a* returns to its rest position (i.e., the center of its travel path) and the conductively connected power-consuming firearm accessory turns OFF.

Operation 1 continued, in some implementations, pressing and moving the sliding element 612*a* of the sliding switch 612 a second distance forward (i.e., Direction B), or rearward (i.e., Direction A), from the center of its travel path (or rest position) will latch the sliding element 612*a* in position, complete a circuit, and leave ON a power-consuming firearm accessory conductively connected thereto via the first cable 632, or the second cable 634 if the sliding element 612*a* was moved rearward. To turn OFF the power-consuming firearm accessory, the sliding element 612*a* is pressed down to unlatch it and then released so that it can return to the rest position. In some implementations, the second distance is a greater distance from the center of the sliding switch travel path than is the first distance (see, e.g., FIG. 6C).

Operation 2: in some implementations, moving the sliding element 612*a* of the sliding switch 612 a first distance forward (i.e., Direction B), or rearward (i.e., Direction A), from the center of its travel path (or rest position) will complete a circuit and turn ON a power-consuming firearm accessory conductively connected thereto via the first cable 632, or the second cable 634 if the sliding element 612*a* was moved rearward. When the sliding element 612*a* is released, the sliding element 612*a* returns to its rest position (i.e., the center of its travel path) and the conductively connected power-consuming firearm accessory turns OFF.

Operation 2 continued, in some implementations, moving the sliding element 612*a* of the sliding switch 612 a second distance forward (i.e., Direction B), or rearward (i.e., Direction A), from the center of its travel path (or rest position) will latch the sliding element 612*a* in position, complete a circuit, and leave ON a power-consuming firearm accessory conductively connected thereto via the first cable 632, or the second cable 634 if the sliding element 612*a* was moved rearward. To turn OFF the power-consuming firearm accessory, the sliding element 612*a* is pressed down to unlatch it and then released so that it can return to the rest position. In some implementations, the second distance is a greater distance from the center of the sliding switch travel path than is the first distance (see, e.g., FIG. 6C).

Operation 3: in some implementations, moving the sliding element 612*a* of the sliding switch 612 a first distance forward (i.e., Direction B), or rearward (i.e., Direction A), from the center of its travel path (or rest position) will complete a circuit and turn ON a power-consuming firearm accessory conductively connected thereto via the first cable 632, or the second cable 634 if the sliding element 612*a* was moved rearward. When the sliding element 612*a* is released, the sliding element 612*a* returns to its rest position (i.e., the center of its travel path) and the conductively connected power-consuming firearm accessory turns OFF.

Operation 3 continued, in some implementations, moving the sliding element 612*a* of the sliding switch 612 forward (i.e., Direction B), or rearward (i.e., Direction A), to the end of its travel path will latch the sliding element 612*a* in position, complete a circuit, and leave ON a power-consuming firearm accessory conductively connected thereto via the first cable 632, or the second cable 634 if the sliding element 612*a* was moved rearward. To turn OFF the power-consuming firearm accessory, the sliding element 612*a* is pressed down to unlatch it and then released so that it can return to the rest position.

Operation 4: in some implementations, progressively moving the sliding element 612*a* of the sliding switch 612 away (e.g., Direction A or B) from the center of its travel path (or rest position) completes a circuit, turns ON a power-consuming firearm accessory conductively connected thereto via the first cable 632 (or the second cable 634 if the sliding element 612*a* was moved rearward (i.e., direction A)) and increases the output (or intensity) of the accessory (i.e., the sliding switch 612 is configured to act as a variable resistor). When the sliding element 612*a* is released, the sliding element 612*a* stays in position and leaves the conductively connected power-consuming firearm accessory ON.

Operation 4 continued, progressively moving the sliding element 612*a* of the sliding switch 612 towards the center of its travel path (or rest position) decreases the output (or intensity) of the accessory conductively connected thereto by a cable 632, 634 of the modular electronic switch system 600. When the slider 612*a* reaches the center of its travel path, the previously powered firearm accessory is turned OFF.

A modular electronic switch system 600, in particular the sliding switch 612 thereof, may be configured to incorporate one or more features, aspects, or elements described in connection with one or more of the above described modes of operation.

Figure 7A:
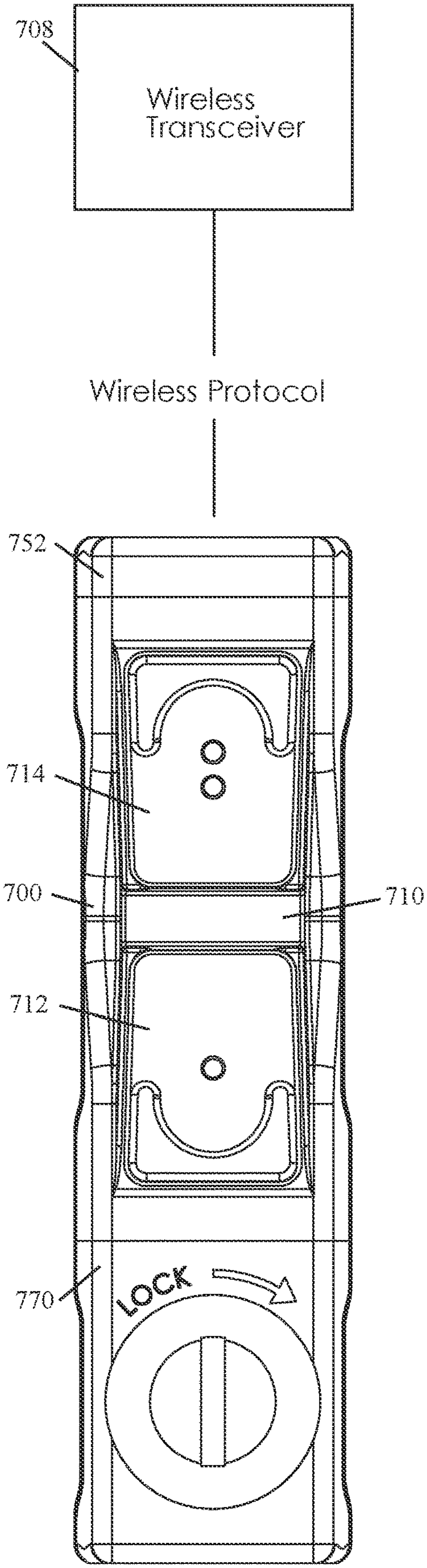
FIG. 7A illustrates yet another example modular electronic switch system according to the principles of the present disclosure.
Figure 7B:
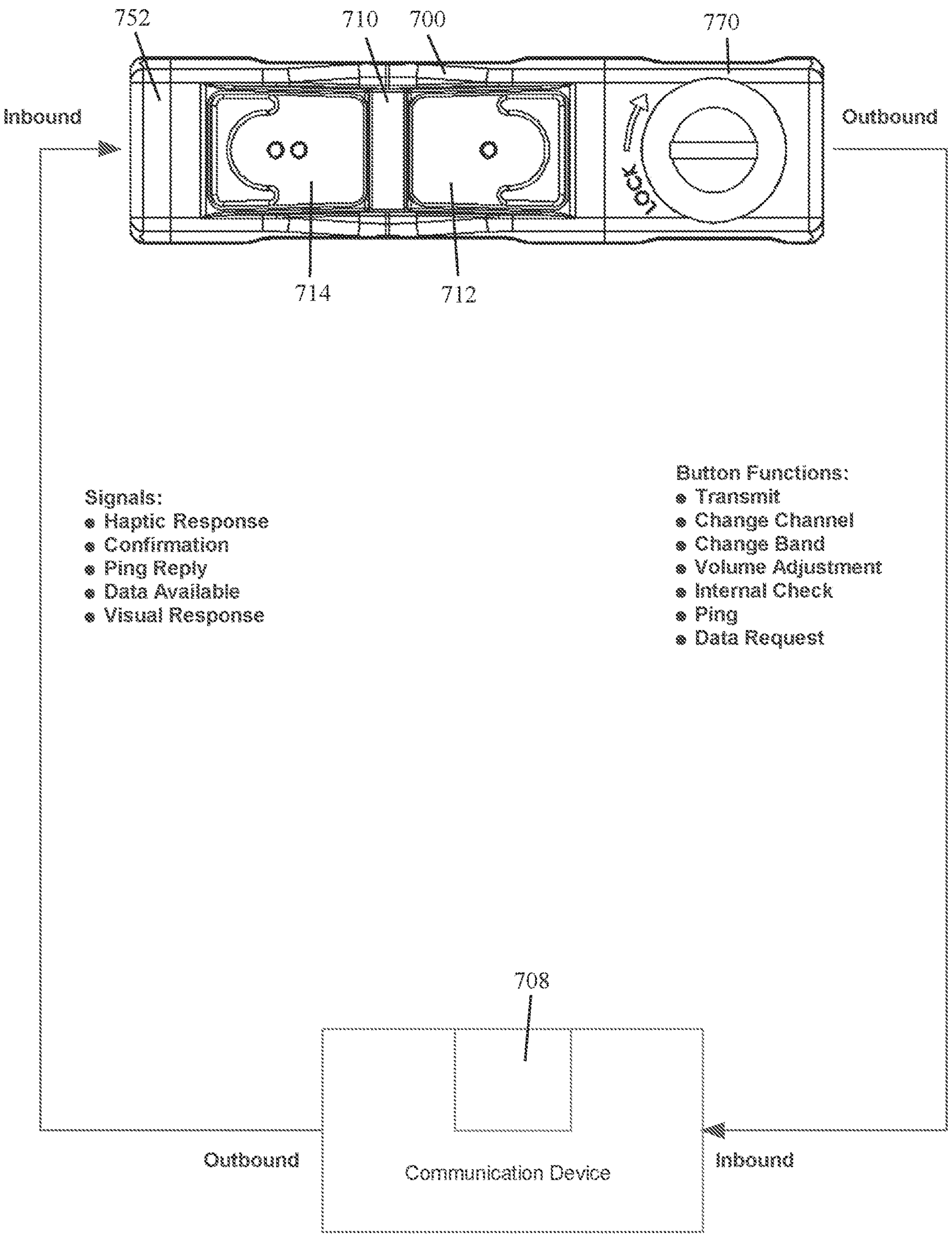
FIGS. 7B and 7C illustrate examples of the modular electronic switch system shown in FIG. 7A that have been configured to operate power consuming accessories having a suitably configured wireless transceiver.
Figure 7C:
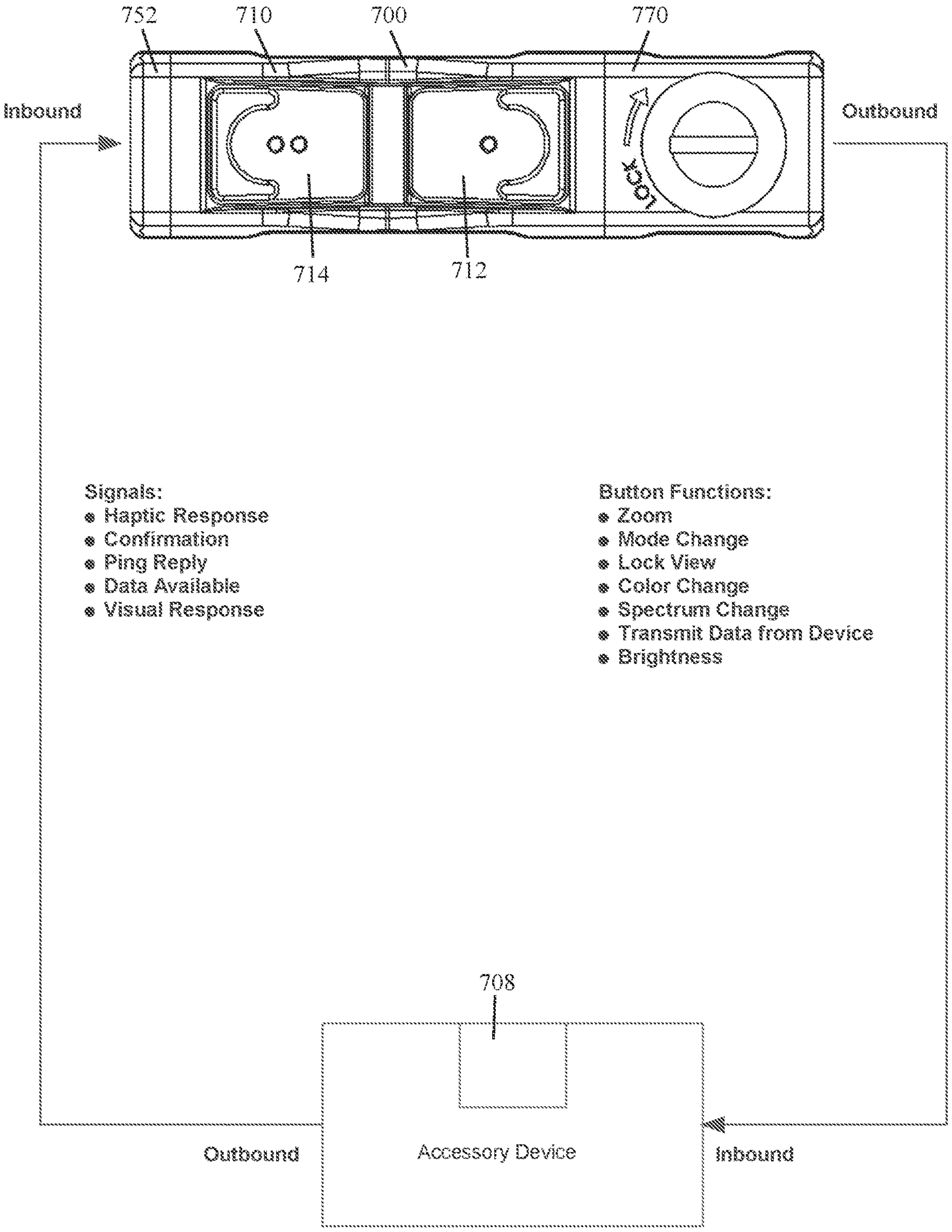

FIGS. 7A-7C illustrate yet another example implementation of a modular electronic switch system 700 according to the principles of the present disclosure. In some implementations, the modular electronic switch system 700 is similar to the modular electronic switch systems 100, 200, 300, 400, 500, 600 discussed above but an end cap 752 has been secured to a first end of the switch body 710 in-lieu of a cable module and the program module 770 includes a wireless transceiver and a suitable communication protocol stored in the nonvolatile memory thereof (e.g., short-link radio technology such as Bluetooth). In this way, the modular electronic switch system 700 is configured to operate power-consuming accessories operationally connected thereto by a suitably configured wireless transceiver 708.

As shown in FIGS. 7A-7C, in some implementations, the wireless transceiver, in conjunction with the communication protocol, is configured to facilitate bi-directional radio communication between the program module 770 and switches 712, 714 of the modular electronic switch system 700 and a power-consuming accessory (e.g., a two-way radio, an illumination device, a laser aiming module, a thermal imager, a night vision device, a laser range finder, etc.) having a compatible wireless transceiver 708. In this way, the one or more switches 712, 714 of the modular electronic switch system 700 can be used to operate the wirelessly connected power-consuming accessory (e.g., change the channel of a two-way radio, used as a push-to-talk switch for a two-way radio, etc.). Also, in some implementations, the transceiver 708 of the wirelessly connected power-consuming accessory may be configured to transmit one or more signals to the modular electronic switch system 700 (e.g., the transceiver 708 may signal the program module 770 to initiate a haptic response felt by the user).

In some implementations, the end cap 752 secured to the first end of the switch body 710, instead of the program module 770, may include the wireless transceiver. In such an implementation, the wireless transceiver is operably connected to the program module 770 of the modular electronic switch system 700 via the switch body 710 (not shown in the drawings).

In some implementations, the program module 770 may be configured so that changes can be made to the nonvolatile memory of the programmable logic board. In this way, the operation of the one or more switches 712, 714 conductively connected to the logic board may be set and/or changed. In some implementations, changing the operation of the one or more switches 712, 714 may include, but is not limited to, setting which switch 712, 714, or switches, is operationally connected to a particular power-consuming accessory. In some implementations, the program module 770 may be configured to facilitate changing the operation parameters of power-consuming accessories operationally connected to the programmable logic board of the modular electronic switch system 700. In some implementations, changing the operation parameters for one or more power-consuming accessories operationally connected to the programmable logic board may include, but is not limited to, setting how a device (e.g., flashlight) will operate (e.g., intensity of illumination, strobe illumination, spectrum of illumination, etc.) when an operationally connected switch (e.g., 712, 714), or switches, is actuated (i.e., pressed).

In some implementations, the program module 770 may include a Universal Serial Bus (USB) port that can be used to facilitate changes to the nonvolatile memory of the programmable logic board (not shown). In some implementations, the USB port is conductively connected to the nonvolatile memory of the programmable logic board found in the program module 770.

FIGS. 7B and 7C each provide a nonlimiting example of a modular electronic switch system 700 that has been configured to operate one or more power-consuming accessories having a suitably configured wireless transceiver 708.

FIG. 7B illustrates an implementation of a modular electronic switch system 700 that is wirelessly connected to a communication device (e.g., a radio) having a suitably configured wireless transceiver 708. In some implementations, the program module 770 may be configured so that the switches 712, 714 of the modular electronic switch system 700 can be set to facilitate the following functions of a wirelessly connected radio when pressed. For example, in some implementations, pressing a switch 712, 714 may cause the radio to transmit, change channel, change band, increase/decrease volume, perform an internal check, verify radio communication and path signal strength between the program module 770 and the wireless transceiver 708 (i.e., ping the radio), send a data request, or a combination thereof. In some implementations, the wireless transceiver 708 may be configured to transmit one or more of the following signals to the modular electronic switch system 700. For example, in some implementations, the wireless transceiver 708 may send a signal to the program module 770 that instructs it to generate a haptic response, a confirmation signal, a signal in reply to a ping the radio signal originally sent by the program module 770, a data available signal, or a combination thereof. In some implementations, the wireless transceiver 708 may transmit the one or more signals in response to a user pressing a switch 712, 714 of the modular electronic switch system 700.

FIG. 7C illustrates an implementation of a modular electronic switch system 700 that is wirelessly connected to a weapon mounted device (e.g., a thermal imager, a night vision device, a laser range finder, etc.) having a suitably configured wireless transceiver 708. In some implementations, the program module 770 may be configured so that the switches 712, 714 of the modular electronic switch system 700 can be set to facilitate the following functions of a weapon mounted device when pressed. For example, in some implementations, pressing a switch 712, 714 may cause the weapon mounted device to zoom in/out, change between modes, lock view, change color, change spectrum (e.g., visible or infrared), verify radio communication and path signal strength between the program module 770 and the wireless transceiver 708 (i.e., ping the radio), transmit data to the program module 770, increase/decrease brightness, or a combination thereof that is suitable for the weapon mounted device wirelessly connected thereto. In some implementations, the wireless transceiver 708 may be configured to transmit one or more of the following signals to the modular electronic switch system 700. For example, in some implementations, the wireless transceiver 708 may send a signal to the program module 770 instructing it to generate a haptic response, a confirmation signal, a reply to a ping the radio signal originally sent by the program module 770, a data available signal, or a combination thereof. In some implementations, the wireless transceiver 708 may transmit the one or more signals in response to a user pressing a switch 712, 714 of the modular electronic switch system 700.

Figure 8A:
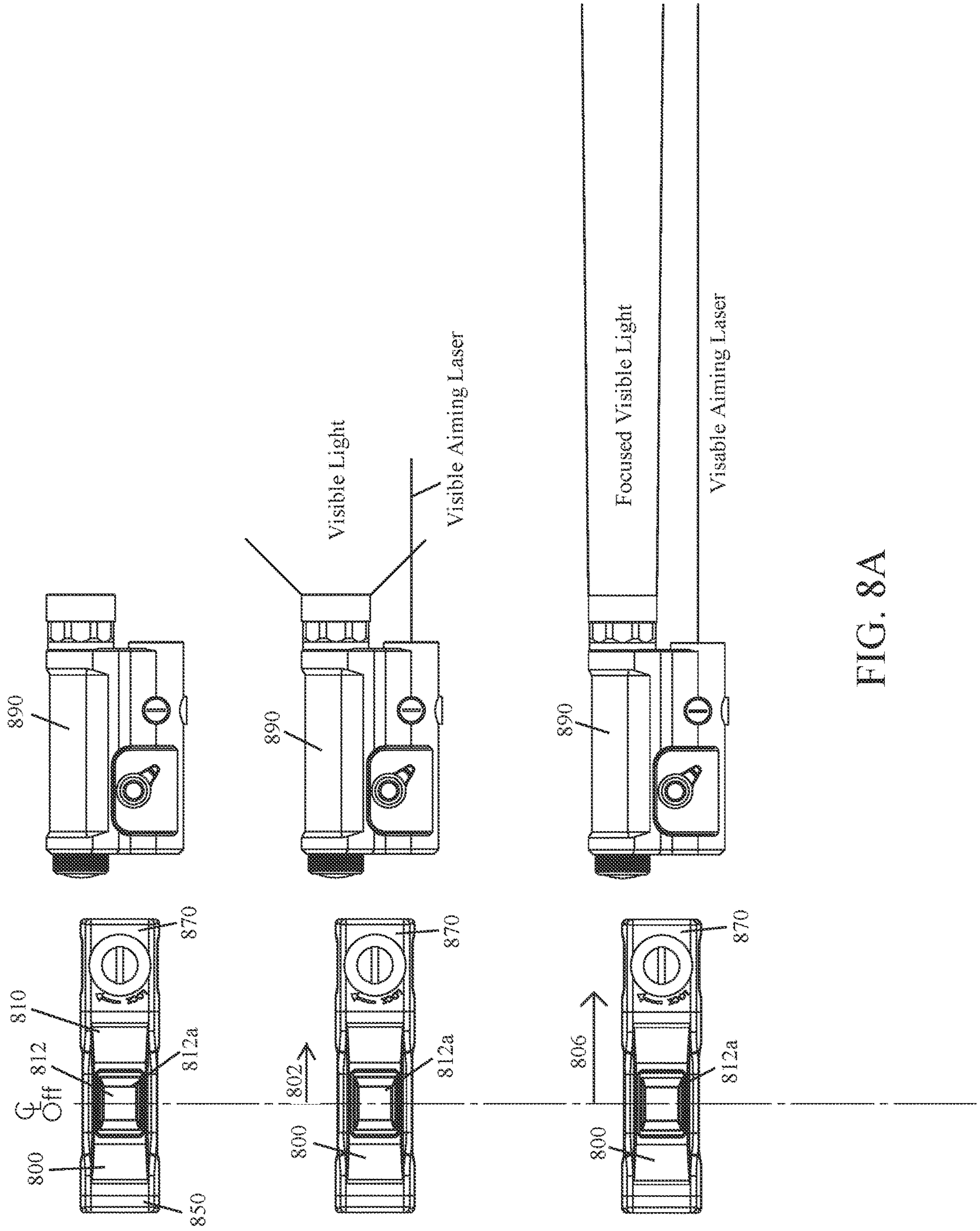
FIGS. 8A and 8B illustrate still yet another example modular electronic switch system according to the principles of the present disclosure; wherein it is shown that linear movement of the slider can be used to activate, and select the output of, one or more operationally connected power-consuming firearm accessories.
Figure 8B:
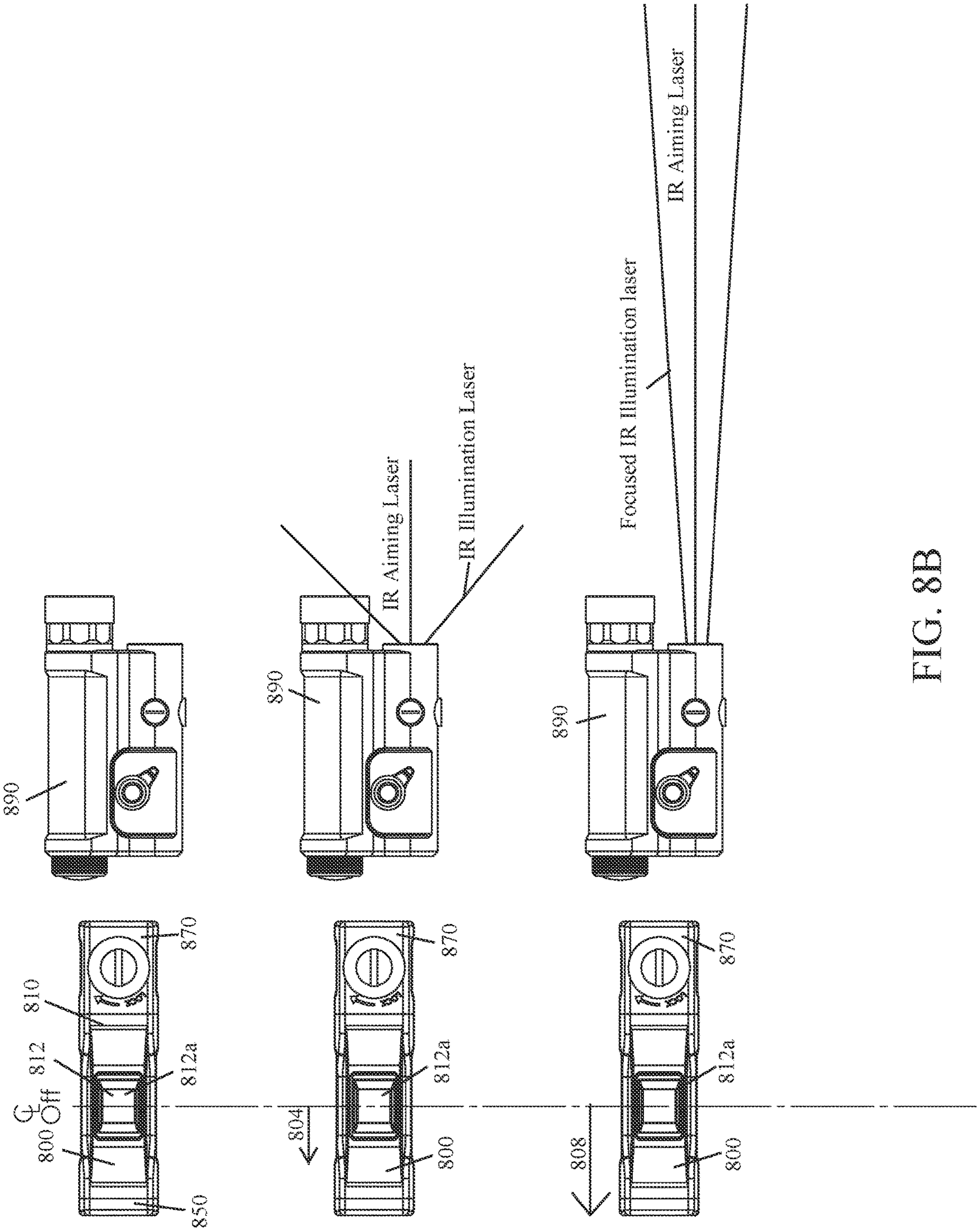

FIGS. 8A and 8B illustrate still yet another example implementation of a modular electronic switch system 800 according to the principles of the present disclosure. In some implementations, the modular electronic switch system 800 is similar to the modular electronic switch systems 100, 200, 300, 400, 500, 600, 700 discussed above, in particular the modular electronic switch systems 600, 700 shown in FIGS. 6A-6C and 7A-7C, but comprises a switch body 810 having a sliding switch 812 that includes a sliding element (also referred to as a slider) 812*a*; a program module 870 that includes a wireless transceiver; and an end cap 850; wherein the program module 870 and the end cap 850 are removably secured to the switch body 810 by fasteners.

As shown in FIGS. 8A and 8B, in some implementations, the modular electronic switch system 800 may be configured so that moving the sliding element 812*a* from the center of its travel path turns ON an operationally connected power-consuming firearm accessory 890 (e.g., a combined illumination device and laser aiming module). Also, the modular electronic switch system 800 may be configured so that the direction in which the sliding element 812*a* is moved controls the output mode of the operationally connected power-consuming firearm accessory 890 (e.g., visible illumination and/or laser; or infrared illumination and/or laser).

In some implementations, as shown in FIG. 8A, the visible output device(s) (e.g., a visible light illumination device and/or a visible laser module) of the operationally connected power-consuming firearm accessory 890 may be activated by moving the sliding element 812*a* in a first direction (indicated by arrows 802 & 806) from the center of its travel path (i.e., towards the program module 870). Further, as shown in FIG. 8B, the infrared output device(s) (e.g., an infrared illuminator and/or an infrared laser module) of the operationally connected power-consuming firearm accessory 890 may be activated by moving the sliding element 812*a* in a second direction (indicated by arrows 804 & 808) from the center of its travel path (i.e., towards the end cap 850).

As shown in FIGS. 8A and 8B, in some implementations, the modular electronic switch system 800 may be configured so that moving the sliding element 812*a* a first distance (indicated by arrows 802 & 804), from the center of its travel path, activates a first output mode for one or more devices of the operationally connected power-consuming firearm accessory 890 (e.g., an illumination device may produce a wide beam of visible or infrared light, while the intensity of a laser (visible or infrared) is adequate for interior spaces). In some implementations, the modular electronic switch system 800 may be configured so that moving the sliding element 812*a* a second distance (indicated by arrows 806 & 808), from the center of its travel path, activates a second output mode for one or more devices of the operationally connected power-consuming firearm accessory 890 (e.g., an illumination device may produce a focused narrow beam of visible light or infrared light, while the intensity of a laser (visible or infrared) may be increased to improve its throw).

While not shown in FIG. 8A or 8B, it will be understood that the power-consuming firearm accessory 890 includes a suitably configured wireless transceiver (e.g., a wireless transceiver 708 as described above) that is used to operationally connect it to the modular electronic switch system 800.

Although not shown in the drawings, it will be understood that suitable wiring and/or traces connect the electrical components of the example modular electronic switch systems 100, 200, 300, 400, 500, 600, 700, 800 disclosed herein.

It should be understood that the switch body, cable module, and end cap or program modular of the modular electronic switch systems 100, 200, 300, 400, 500, 600, 700, 800 discussed above are intended to be interchangeable. In this way, a user is able to configure a modular electronic switch system to operate selected power-consuming accessories with a desired presentation of the controls.

Figure 9:
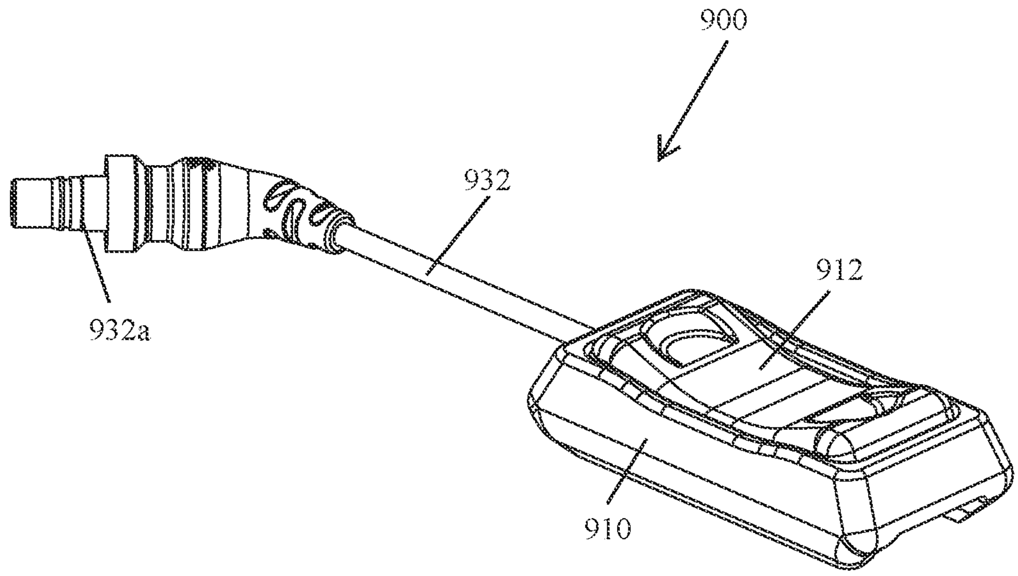
FIG. 9 illustrates an example remote switch device according to the principles of the present disclosure.

FIG. 9 illustrates an example remote switch device 900 according to the principles of the present disclose. The remote switch device 900 is similar to the modular electronic switch system 100, 200, 300, 400, 500, 600, 700, 800 discussed above but is not modular and includes a non-binary position and force sensor (e.g., a rocker type switch). The remote switch device 900 can be used to operate (e.g., turn on/off) power-consuming firearm accessories (e.g., an illumination device, a laser aiming module, etc.) conductively connected thereto by a suitably configured flexible cable. The remote switch device 900 can be secured to a Picatinny rail interface, but could be configured for attachment to another mounting interface for firearm accessories (e.g., KeyMod or M-LOK® negative space mounting slots).

As shown in FIG. 9, in some implementations, the remote switch device 900 comprises a housing 910 configured to engage with a mounting interface for firearm accessories. The housing 910 includes a switch 912 and a cable 932 having a plug 932*a*. The switch 912 is a non-binary position and force sensor configured to operate a conductively connected power-consuming accessory. The plug 932*a* of the cable 932 is adapted for being conductively connected to a complementary connecter of the power-consuming accessory, and the cable is configured to conductively connect the switch 912 to the plug 932*a*.

The non-binary position and force sensor 912 may be configured to change the output of a connected power-consuming accessory based on contact, duration of contact, magnitude of force applied during contact, or a combination thereof. In some implementations, the non-binary position and force sensor 912 may be a multi-pole rocker switch configured to provide momentary and/or maintained functions. In some implementations, the non-binary position and force sensor 912 may be a digital switch, a touch sensor, or other suitable sensor or switch, known to one of ordinary skill in the art, that would be suitable for use as part of a remote switch device 900.

In some implementations, the remote switch device 900 may include an electronic circuit that performs the same functions as an above described program module (e.g., program model 270, 570, 770, 870). This electronic circuit could be integrated into the housing 910 of the remote switch device 900. In this way, the first switch 912, in conjunction with the electronic circuit, can be used to manipulate the output of any power-consuming accessory conductively connected thereto.

Alternatively, in some implementations, the housing 910 of a remote switch device 900 could be adapted so that a program module (e.g., program module 270, 570, 770, 870) can be removably secured thereto (not shown).

In some implementations, the remote switch device 900 further comprises a transceiver configured to operate power-consuming accessories wirelessly connected thereto. In such an implementation, the communication protocol for the transceiver is stored in the nonvolatile memory of the electronic circuit described above. The transceiver may be the same as, or similar to, the transceiver described above in connection with the modular electronic switch system 700 shown in FIGS. 7A-7C.

Although not shown in the drawings, it should be understood that the remote switch device 900 could be configured to include one or more additional switches and/or cables.

Although not shown in the drawings, it will be understood that suitable wiring and/or traces connect the electrical components of the remote switch device 900 disclosed herein.

Reference throughout this specification to "an embodiment" or "implementation" or words of similar import means that a particular described feature, structure, or characteristic is included in at least one embodiment of the present invention. Thus, the phrase "in some implementations" or a phrase of similar import in various places throughout this specification does not necessarily refer to the same embodiment.

Many modifications and other embodiments of the inventions set forth herein will come to mind to one skilled in the art to which these inventions pertain having the benefit of the teachings presented in the foregoing descriptions and the associated drawings.

The described features, structures, or characteristics may be combined in any suitable manner in one or more embodiments. In the above description, numerous specific details are provided for a thorough understanding of embodiments of the invention. One skilled in the relevant art will recognize, however, that embodiments of the invention can be practiced without one or more of the specific details, or with other methods, components, materials, etc. In other instances, well-known structures, materials, or operations may not be shown or described in detail.

While operations are depicted in the drawings in a particular order, this should not be understood as requiring that such operations be performed in the particular order shown or in sequential order, or that all illustrated operations be performed, to achieve desirable results.

The invention claimed is:

1. A remote switch device configured for use with conductively connected power-consuming firearm accessories, the remote switch device comprising:

a housing configured to engage with a mounting interface for firearm accessories;

a first switch configured to operate conductively connected power-consuming firearm accessories, the first switch includes a force sensing resistor; and at least a first cable having a connector, the first cable is configured to conductively connect the first switch to the connector, the connector is adapted for being conductively connected to a complementary connecter of a power-consuming firearm accessory;

wherein the first switch is positioned substantially parallel to the mounting interface for firearm accessories while the housing is secured thereto.

2. The remote switch device of claim 1, further comprising: a second switch configured to operate conductively connected power-consuming firearm accessories, the second switch includes a force sensing resistor; and a second cable having a connector, the second cable is configured to conductively connect the second switch to the connector of the second cable, the connector of the second cable is adapted for being conductively connected to a complementary connecter of a power-consuming firearm accessory.

3. A remote switch device configured for use with wirelessly connected power-consuming firearm accessories, the remote switch device comprising:

a housing configured to engage with a mounting interface for firearm accessories;

a first switch configured to operate at least one wirelessly connected power-consuming firearm accessory, the first switch includes a force sensing resistor; and a wireless transceiver configured to operably connect the first switch to at least one wirelessly connected power-consuming firearm accessory;

wherein the first switch is positioned substantially parallel to the mounting interface for firearm accessories while the housing is secured thereto.

4. The remote switch device of claim 3, further comprising a second switch configured to operate at least one wirelessly connected power-consuming firearm accessory, the second switch includes a force sensing resistor; wherein the wireless transceiver is also configured to operably connect the second switch to at least one wirelessly connected power-consuming firearm accessory.

* * * * *